United States Patent
Chiang et al.

(10) Patent No.: US 11,172,590 B2
(45) Date of Patent: Nov. 9, 2021

(54) ELECTRONIC DEVICE AND FLUID DRIVING DEVICE

(71) Applicants: Inventec (Pudong) Technology Corporation, Shanghai (CN); INVENTEC CORPORATION, Taipei (TW)

(72) Inventors: Meng-Lung Chiang, Taipei (TW); Tung-Han Wu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/899,749

(22) Filed: Jun. 12, 2020

(65) Prior Publication Data
US 2021/0289657 A1    Sep. 16, 2021

(30) Foreign Application Priority Data
Mar. 12, 2020   (CN) .......................... 202010172647.8

(51) Int. Cl.
| H05K 7/20 | (2006.01) |
| G06F 1/20 | (2006.01) |
| F28F 3/12 | (2006.01) |
| F28F 3/02 | (2006.01) |

(52) U.S. Cl.
CPC ......... *H05K 7/20136* (2013.01); *G06F 1/203* (2013.01); *H05K 7/20218* (2013.01); *F28F 3/02* (2013.01); *F28F 3/12* (2013.01); *G06F 2200/201* (2013.01)

(58) Field of Classification Search
CPC ............ H05K 7/20136; H05K 7/20218; G06F 1/203; G06F 2200/201; F28F 3/12; F28F 3/02
See application file for complete search history.

(56) References Cited

U.S. PATENT DOCUMENTS

| 3,788,393 | A | * | 1/1974 | Plizak | ........................ | F28F 3/12 |
| | | | | | | 165/109.1 |
| 4,898,231 | A | * | 2/1990 | Miyazaki | ............ | F28D 15/0233 |
| | | | | | | 165/104.25 |
| 9,559,037 | B2 | * | 1/2017 | Eid | ....................... | H05K 1/0203 |
| 2004/0037035 | A1 | * | 2/2004 | Ohashi | ..................... | G06F 1/203 |
| | | | | | | 361/679.53 |

(Continued)

*Primary Examiner* — Stephen S Sul
(74) *Attorney, Agent, or Firm* — Locke Lord LLP; Tim Tingkang Xia, Esq.

(57) ABSTRACT

The disclosure provides a fluid driving device including a casing and an oscillation film. The casing has a fluid chamber, a liquid inlet, a liquid outlet, and a vent hole. The oscillation film is movably disposed in the fluid chamber so as to divide the fluid chamber into a liquid channel and a gas channel that are not fluid-connected to each other. The liquid inlet and the liquid outlet are connected to the liquid channel, and the vent hole is connected to the gas channel. When the oscillation film oscillates, it forces liquid to flow into the liquid channel from the liquid inlet and forces gas to flow out of the gas channel from the vent hole, or it forces the liquid to flow out of the liquid channel from the liquid outlet and forces the gas to flow into the gas channel from the vent hole.

10 Claims, 9 Drawing Sheets

(56) References Cited

U.S. PATENT DOCUMENTS

| | | | | |
|---|---|---|---|---|
| 2005/0178529 A1* | 8/2005 | Suzuki | ............... | H01L 23/473 |
| | | | | 165/80.4 |
| 2005/0231914 A1* | 10/2005 | Mikubo | ............... | H01L 23/473 |
| | | | | 361/699 |
| 2009/0167109 A1* | 7/2009 | Tomita | ............... | H04N 5/22521 |
| | | | | 310/317 |
| 2009/0262500 A1* | 10/2009 | Makino | ............... | H01L 23/4735 |
| | | | | 361/697 |
| 2015/0173237 A1* | 6/2015 | Lin | ............... | H01L 23/467 |
| | | | | 361/690 |
| 2019/0307020 A1* | 10/2019 | Nakae | ............... | F28F 3/02 |
| 2020/0053905 A1* | 2/2020 | Ganti | ............... | H01L 41/00 |
| 2020/0229320 A1* | 7/2020 | Mou | ............... | A41D 13/002 |

* cited by examiner

ELECTRONIC DEVICE AND FLUID DRIVING DEVICE

CROSS-REFERENCE TO RELATED APPLICATIONS

This non-provisional application claims priority under 35 U.S.C. § 119(a) on Patent Application No(s). 202010172647.8 filed in China on Mar. 12, 2020, the entire contents of which are hereby incorporated by reference.

BACKGROUND OF THE INVENTION

Technical Field of the Invention

The disclosure relates to an electronic device and a fluid driving device, more particularly to an electronic device and a fluid driving device using an oscillation film to drive liquid and gas.

Description of the Related Art

As technology progresses, electronic devices, such as laptop computers, have become more powerful over the years and therefore generate more heat. In order to prevent internal electronic components from easily damaged by heat accumulation, it is desirable to improve their ability in resisting heat.

In addition to chasing better performance, lightweight and miniaturization are also important topics for electronic devices. For this aspect, the electronic components need to be arranged very compact in a very limited internal space, such that, heat source, such as the central processing unit, is inevitably placed close to the device casing. Thus, waste heat generated by the heat source will be distributed to the device casing so that the users will perceive heat discomfort while holding the device. Some try to deliberately decrease the performance of the electronic component so as to reduce the amount of heat, but this approach is not effective for all conditions. Therefore, how to effectively reduce heat transferred to the device casing to avoid heat discomfort while operating in high performance mode.

SUMMARY OF THE INVENTION

The disclosure provides an electronic device and a fluid driving device that are capable of effectively reduce heat transferred to the device casing to avoid heat discomfort.

One embodiment of the disclosure provides a fluid driving device configured to force a liquid and a gas. The fluid driving device includes a casing and an oscillation film. The casing has a fluid chamber, a liquid inlet, a liquid outlet, and at least one vent hole. The oscillation film is movably disposed in the fluid chamber of the casing so as to divide the fluid chamber into a liquid channel and a gas channel that are not fluid-connected to each other. The liquid channel and the gas channel are respectively configured to accommodate the liquid and the gas. The liquid inlet and the liquid outlet are connected to the liquid channel, and the at least one vent hole is connected to the gas channel. When the oscillation film is triggered to oscillate to compress the gas channel, the oscillation film forces the liquid to flow into the liquid channel from the liquid inlet and forces the gas to flow out of the gas channel from the at least one vent hole. When the oscillation film is triggered to oscillate to compress the liquid channel, the oscillation film forces the liquid to flow out of the liquid channel from the liquid outlet and forces the gas to flow into the gas channel from the at least one vent hole.

Another embodiment of the disclosure provides an electronic device. The electronic device includes a housing, a heat source, and a fluid driving device. The housing has an internal space. The heat source is located in the internal space. The fluid driving device is located in the internal space of the housing and includes a casing and an oscillation film. The casing has a fluid chamber, a liquid inlet, a liquid outlet and at least one vent hole. The oscillation film is movably disposed in the fluid chamber of the casing so as to divide the fluid chamber into a liquid channel and a gas channel that are not fluid-connected to each other. The liquid inlet and the liquid outlet are connected to the liquid channel, and the at least one vent hole is connected to the gas channel.

According to the electronic devices and the fluid driving devices as discussed above, the oscillation film divides the fluid chamber of the casing into the liquid channel and the gas channel, such that the oscillation film can repeatedly compress the liquid channel and the gas channel to force the liquid existing in the liquid channel and the gas existing in the gas channel to flow during operation. In the case that the fluid driving device is disposed in the internal space of the housing of an electronic device, the fluid driving device can not only trigger the liquid to cool the heat source but also can force the gas to flow to create airflow to disturb the air existing in the internal space of the housing to make the heat generated by the heat source difficult to reach the housing.

BRIEF DESCRIPTION OF THE DRAWINGS

The present disclosure will become more fully understood from the detailed description given hereinbelow and the accompanying drawings which are given by way of illustration only and thus are not limitative to the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present disclosure is not limited thereto. Furthermore, for the purpose of illustration, some of the structures and components in the figures are simplified, and wires, reference lines or buses are omitted in some of the figures.

Moreover, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
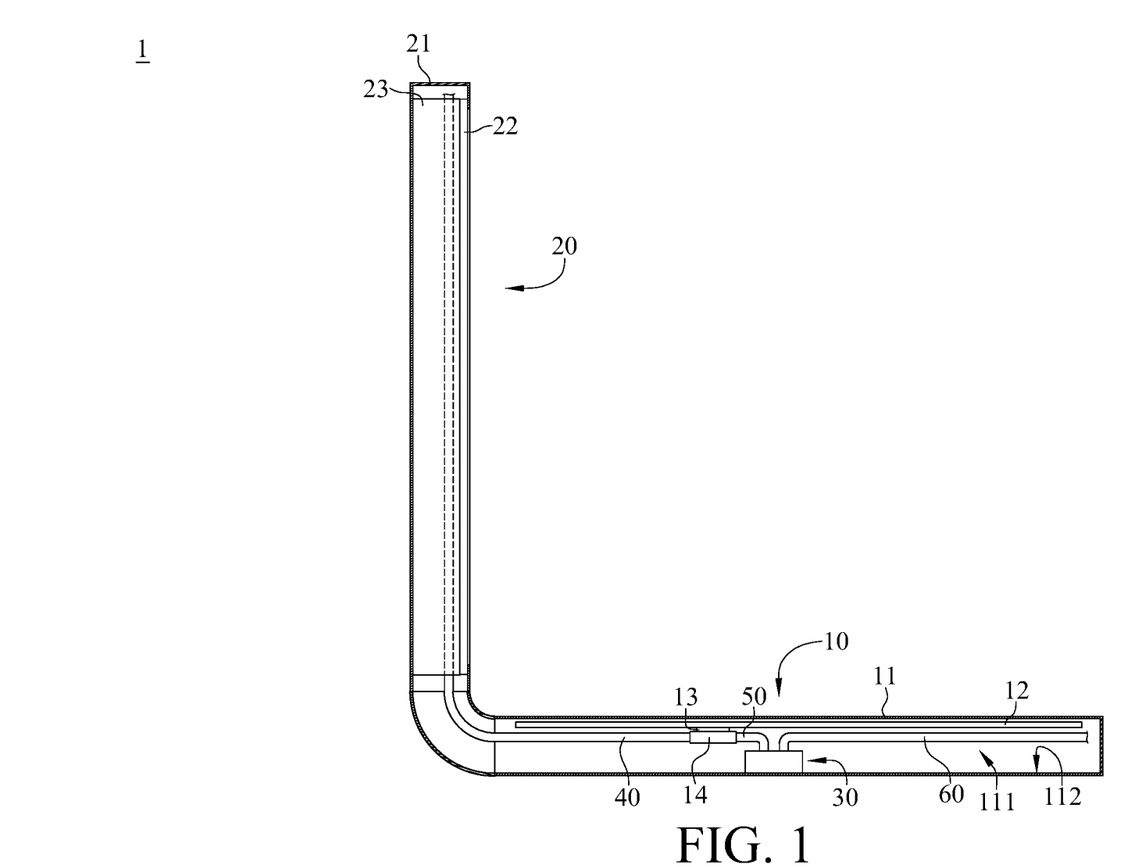
FIG. 1 is a cross-sectional view of an electronic device according to a first embodiment of the disclosure.
Figure 2:
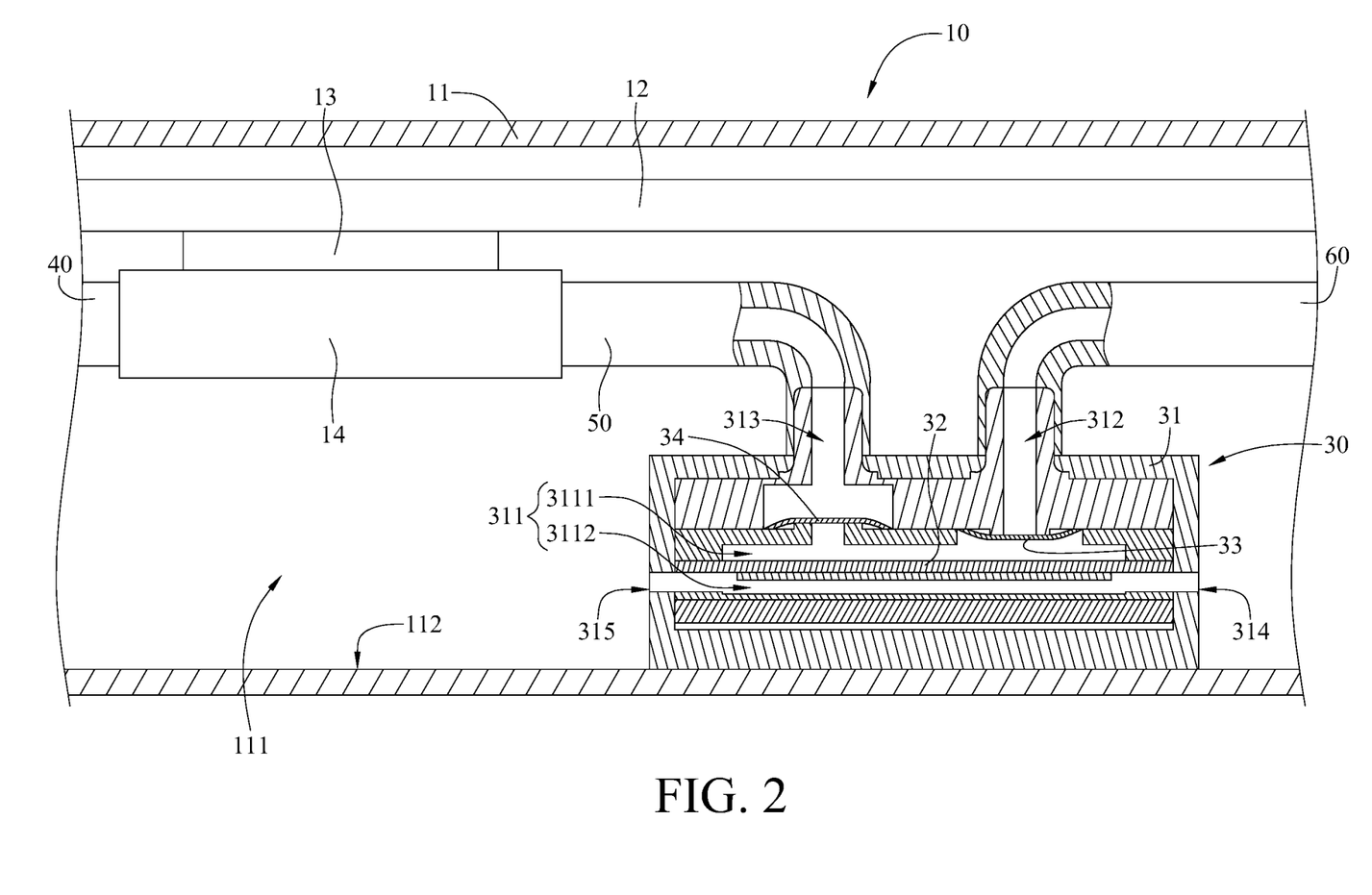
FIG. 2 is a partial enlarged cross-sectional view of the electronic device in FIG. 1.

Referring to FIGS. 1 and 2, there are shown a cross-sectional view of an electronic device 1 according to a first embodiment of the disclosure and a partial enlarged cross-sectional view of the electronic device 1 in FIG. 1.

In this embodiment, the electronic device 1 is, for example, a laptop computer. The electronic device 1 includes a host part 10, a display part 20, and a fluid driving device 30.

The host part 10 includes a housing 11, a circuit board 12, a heat source 13, and a water block 14. The housing 11 has an internal space 111 and an inner bottom surface 112 located in the internal space 111. The circuit board 12 is located in the internal space 111 of the housing 11. The heat source 13 is, for example, a central processing unit. The heat source 13 is disposed on the circuit board 12. The water block 14 is thermally in contact with the heat source 13 and is spaced apart from the inner bottom surface 112 of the housing 11. The water block 14 is configured to absorb heat generated by the heat source 13.

The display part 20 includes a housing 21, a display panel 22 disposed on the housing 21, and a heat dissipation component 23. The housing 21 of the display part 20 is connected to the housing 11 of the host part 10. The heat dissipation component 23 is disposed in the housing 21 of the display part 20 and is connected to the water block 14 via a pipe 40. The heat dissipation component 23 is, for example, thermally in contact with the housing 21 of the display part 20.

The fluid driving device 30 is located in the internal space 111 of the housing 11 of the host part 10 and is spaced apart from the heat source 13. The fluid driving device 30 includes a casing 31 and an oscillation film 32. The casing 31 has a fluid chamber 311, a liquid inlet 312, a liquid outlet 313, and two vent holes 314 and 315. The oscillation film 32 is, for example, a piezoelectric film. The oscillation film 32 is movably disposed in the fluid chamber 311 of the casing 31 so as to divide the fluid chamber 311 into a liquid channel 3111 and a gas channel 3112 that are not fluid-connected to each other. The liquid channel 3111 and the gas channel 3112 are respectively configured to accommodate liquid substance (not shown) and gas substance (not shown). The liquid inlet 312 and the liquid outlet 313 are connected to the liquid channel 3111, and the vent holes 314 and 315 are connected to the gas channel 3112. Furthermore, the vent holes 314 and 315 are also connected to the internal space 111 of the housing 11. The liquid inlet 312 is connected to the heat dissipation component 23, for example, via a pipe 60, and the liquid outlet 313 is connected to the water block 14, for example, via a pipe 50. As such, the fluid driving device 30, the water block 14, the heat dissipation component 23 and the pipes 40, 50 and 60 together form a closed loop.

In this embodiment, the fluid driving device 30 further includes two one-way valves 33 and 34. The one-way valves 33 and 34 are respectively disposed at liquid inlet 312 and the liquid outlet 313 of the casing 31. The one-way valve 33 is configured to allow the liquid to only flow into the liquid channel 3111 from the liquid inlet 312, and the one-way valve 34 is configured to allow the liquid to only flow out of the liquid channel 3111 from the liquid outlet 313.

Figure 3:
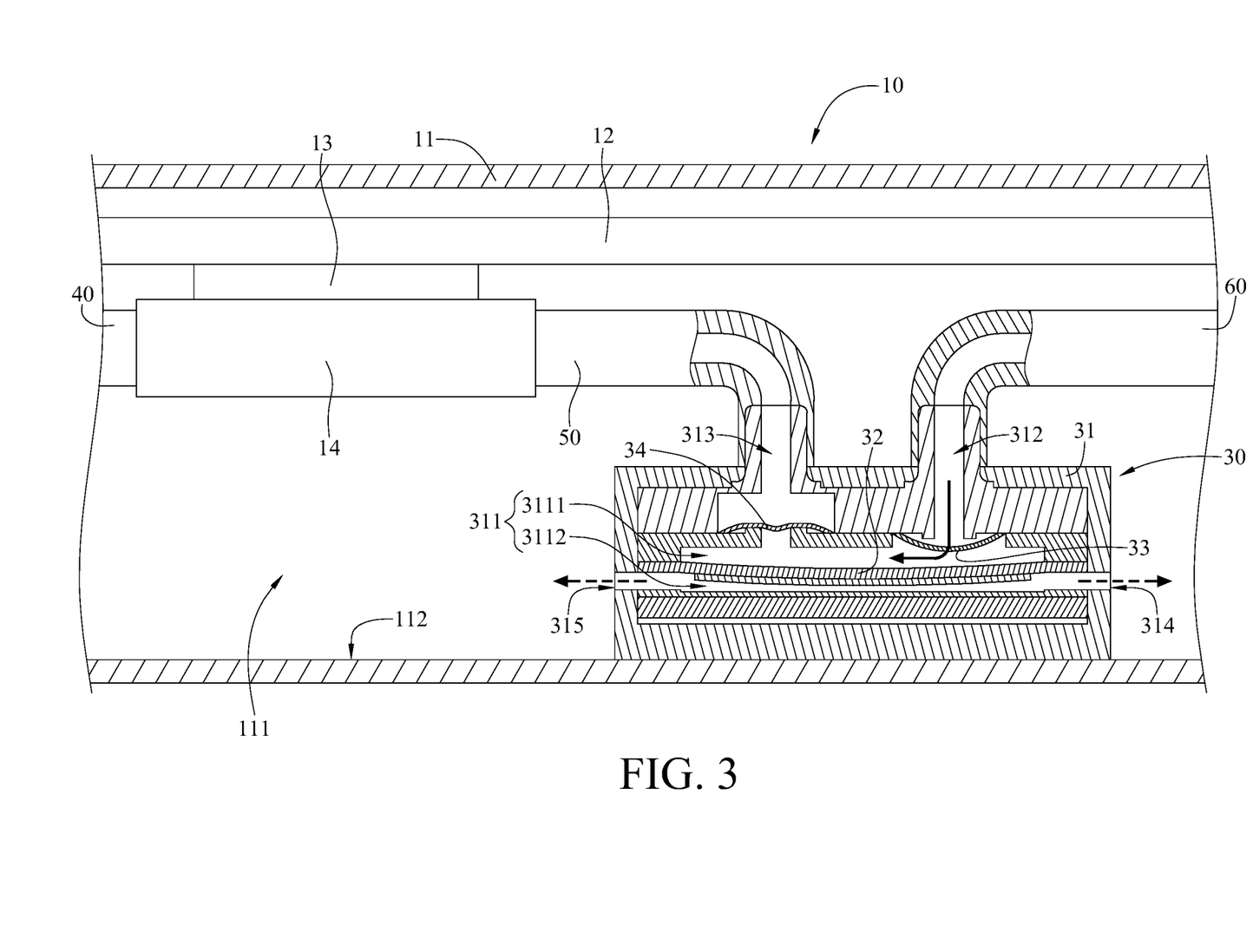
FIG. 3 is a partial enlarged cross-sectional view of the electronic device in FIG. 1 when an oscillation film of a fluid driving device compresses a gas channel.
Figure 4:
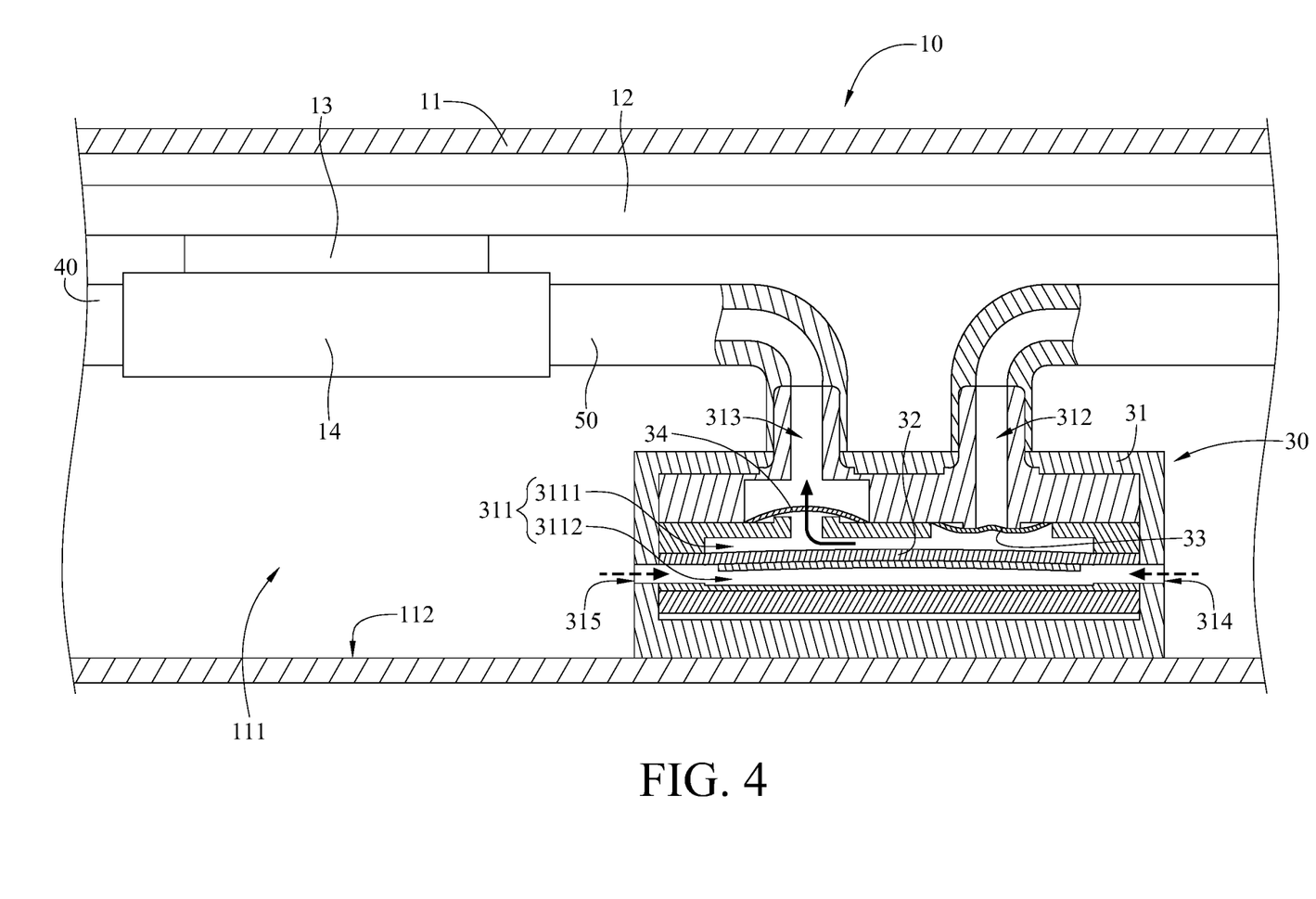
FIG. 4 is a partial enlarged cross-sectional view of the electronic device in FIG. 1 when the oscillation film of the fluid driving device compresses a liquid channel.

In this embodiment, the oscillation film 32 can be supplied with electricity to oscillate (e.g., move or vibrate back and forth at a specific speed) so as to change the volumes of the gas channel 3112 and the liquid channel 3111 of the casing 31. Specifically, referring to FIGS. 3 and 4, FIG. 3 is a partial enlarged cross-sectional view of the electronic device 1 in FIG. 1 when the oscillation film 32 of the fluid driving device 30 compresses the gas channel 3112, and FIG. 4 is a partial enlarged cross-sectional view of the electronic device 1 in FIG. 1 when the oscillation film 32 of the fluid driving device 30 compresses the liquid channel 3111. In FIGS. 3 and 4, the solid arrows represent the flow of the liquid while the dash arrows represent the flow of the gas.

As shown in FIG. 3, when the oscillation film 32 is vibrating to compress the gas channel 3112 of the casing 31, the volume of the liquid channel 3111 of the casing 31 is increased. At this moment, the oscillation film 32 can suck the liquid into the liquid channel 3111 from the liquid inlet 312 and force the gas to flow out of the gas channel 3112 from the vent holes 314 and 315 so as to create airflow flowing towards the internal space 111 of the housing 11. Such airflow is sufficient to disturb the air existing in the internal space 111 of the housing 11 and therefore makes the heat generated by the heat source 13 difficult to reach the housing 11.

As shown in FIG. 4, when the oscillation film 32 is vibrating to compress the liquid channel 3111 of the casing 31, the volume of the gas channel 3112 of the casing 31 is increased. At this moment, the oscillation film 32 can force the liquid to flow out of the liquid channel 3111 from the liquid outlet 313 and suck the gas into the gas channel 3112 from the vent holes 314 and 315. As such, the liquid is forced to flow towards the water block 14 via the pipe 50 to perform heat exchange with the heat source 13 and thus cooling the heat source 13. Then, the liquid flowing through the heat source 13 is pumped to the heat dissipation component 23 via the pipe 40 and then is cooled by the heat dissipation component 23. Then, as the oscillation film 32 continuously vibrates to compress the gas channel 3112 of the casing 31, the liquid is pumped to the fluid driving device 30 to finish one circulation.

In this embodiment, the oscillation film 32 may be made of a thermal conductive material. After the gas flows into the gas channel 3112 from the vent holes 314 and 315, the gas in the gas channel 3112 can perform heat exchange with liquid in the liquid channel 3111 via the oscillation film 32 and therefore be cooled. Therefore, when the oscillation film 32 compresses the gas channel 3112 of the casing 31, the low temperature gas can be blow out, which makes the heat generated by the heat source 13 more difficult to be transmitted to the housing 11. However, the invention is not limited by the material of the oscillation film; in some other embodiments, the oscillation film may be made of a thermal insulation material.

In this embodiment, the quantity of the vent holes of the casing 31 of the fluid driving device 30 are not restricted to be two; in some other embodiments, the casing of the fluid driving device may have only one vent hole.

Figure 5:
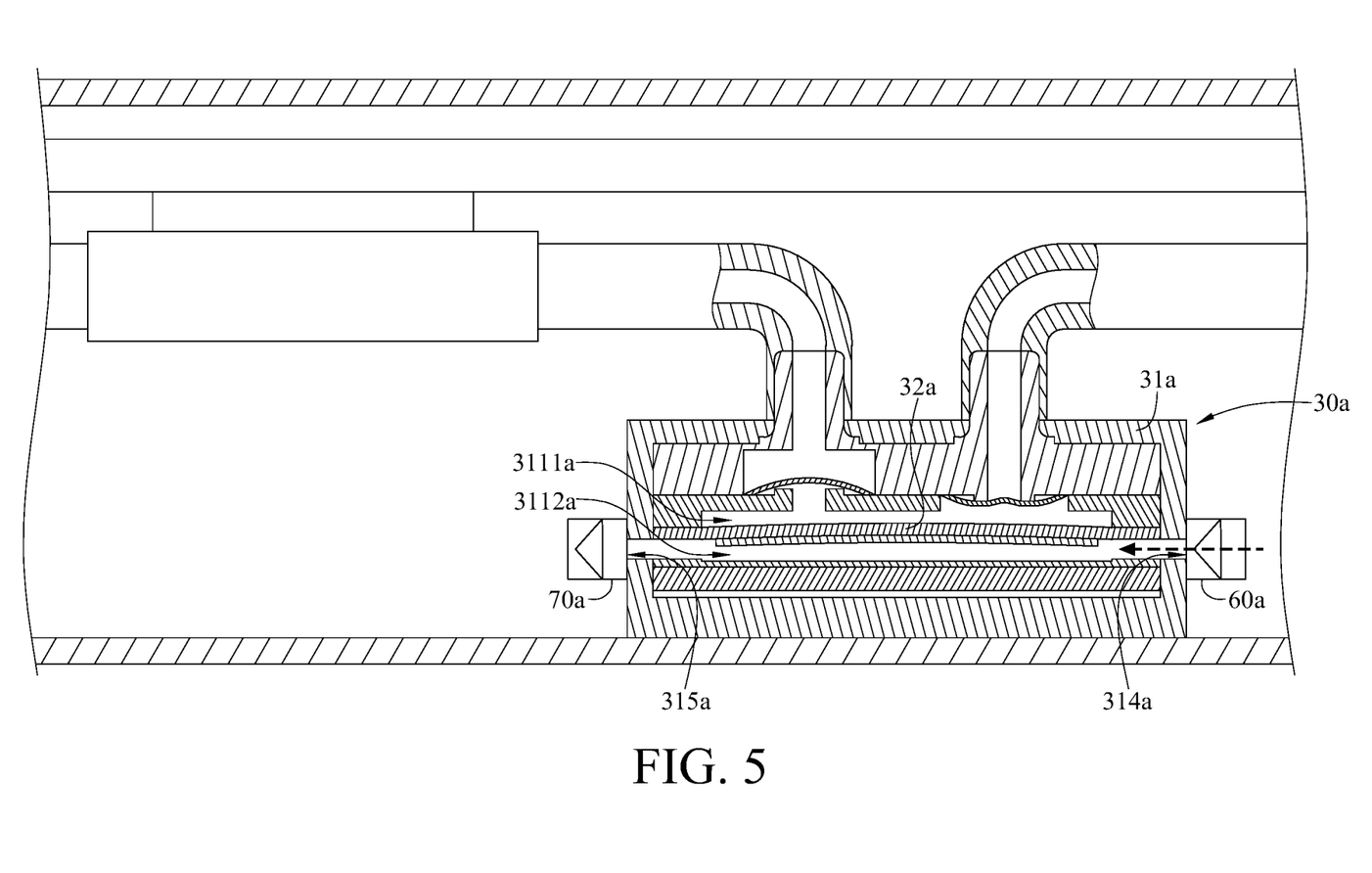
FIG. 5 is a partial enlarged cross-sectional view of an electronic device according to a second embodiment of the disclosure when an oscillation film of a fluid driving device compresses a gas channel.
Figure 6:
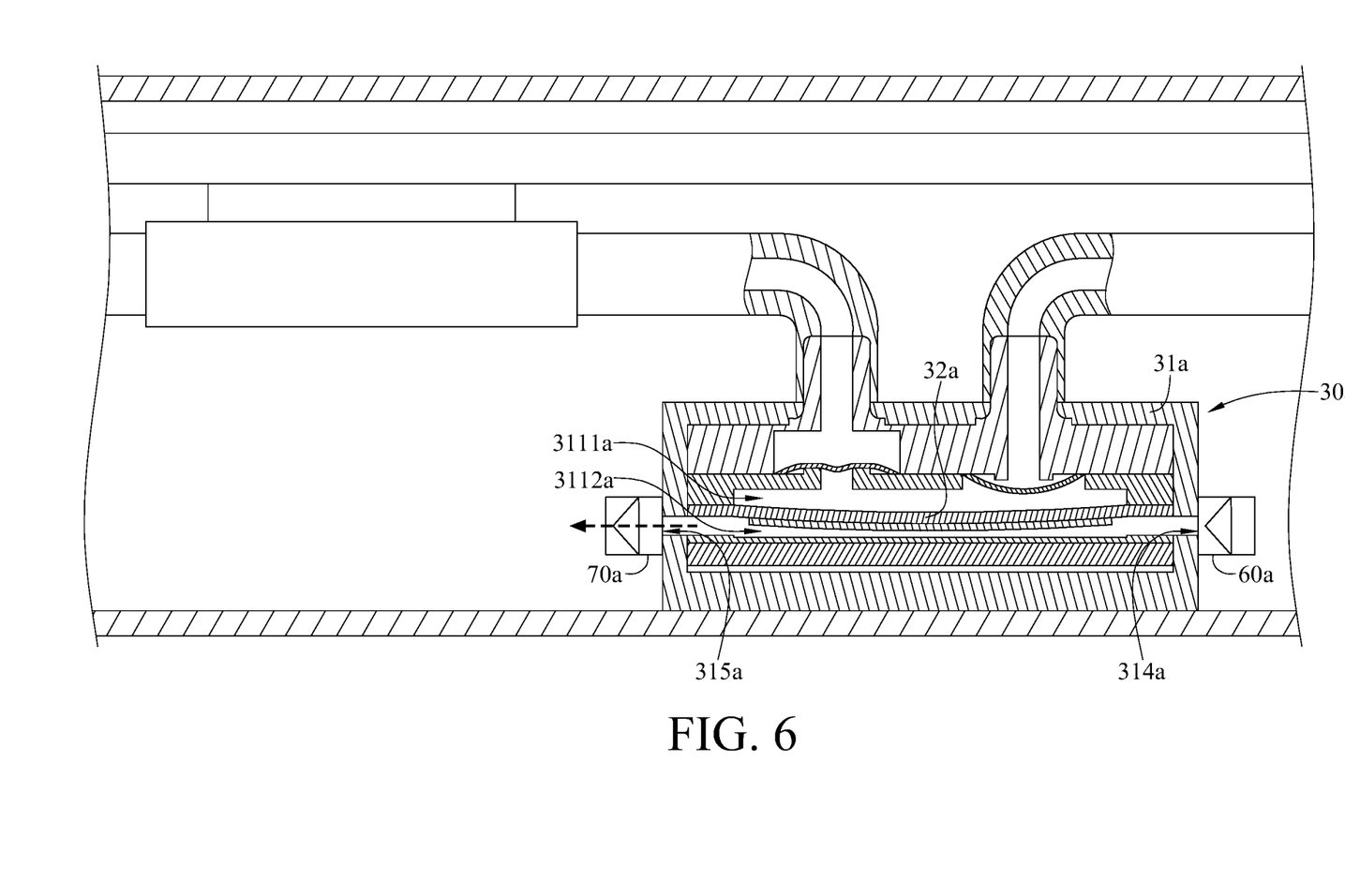
FIG. 6 is a partial enlarged cross-sectional view of the electronic device in FIG. 5 when the oscillation film of the fluid driving device compresses a gas channel.

Then, referring to FIGS. 5 and 6, FIG. 5 is a partial enlarged cross-sectional view of an electronic device according to a second embodiment of the disclosure when an oscillation film 32a of a fluid driving device 30a compresses a gas channel 3111a, and FIG. 6 is a partial enlarged cross-sectional view of the electronic device in FIG. 5 when the oscillation film 32a of the fluid driving device 30a compresses a gas channel 3112a. Arrows in FIGS. 5 and 6 represent the flow of the gas.

In the following descriptions, for the purpose of clear and simple explanation, the details of structures and components the same as or similar to those in the above descriptions will be omitted, that is, the following descriptions are mainly focused on the differences between this and the aforementioned embodiments and the same and similar parts will not be repeated.

In this embodiment, the fluid driving device 30a further includes another two one-way valves 60a and 70a. The one-way valves 60a and 70a are respectively disposed at two vent holes 314a and 315a of a casing 31a. The one-way valve 60a is configured to allow the gas to only flow into the gas channel 3112a from the vent hole 314a, and the one-way valve 70a is configured to allow the gas to only flow out of the gas channel 3112a from the vent hole 315a. As such, as shown in FIG. 5, when the oscillation film 32a compresses the liquid channel 3111a of the casing 31a, the oscillation film 32a sucks the gas into the gas channel 3112a from the vent hole 314a rather than from the vent hole 315a. As shown in FIG. 6, when the oscillation film 32a compresses the gas channel 3112a of the casing 31a, the oscillation film 32a forces the gas to flow out of the gas channel 3112a from the vent hole 315a rather than from the vent hole 314a.

Figure 7:
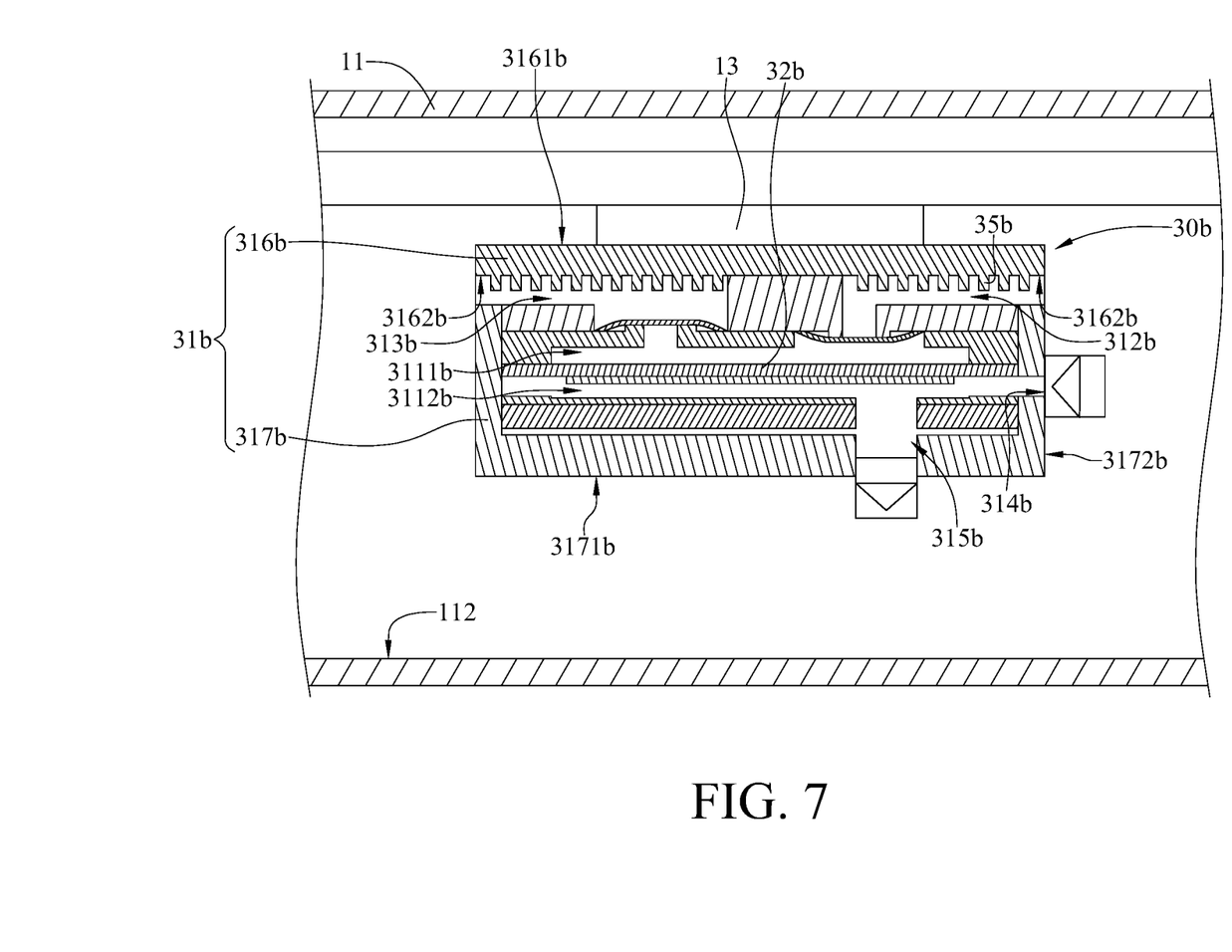
FIG. 7 is a partial enlarged cross-sectional view of an electronic device according to a third embodiment of the disclosure.

Then, referring to FIG. 7, FIG. 7 is a partial enlarged cross-sectional view of an electronic device according to a third embodiment of the disclosure.

In the following descriptions, for the purpose of clear and simple explanation, the details of structures and components the same as or similar to those in the above descriptions will be omitted, that is, the following descriptions are mainly focused on the differences between this and the aforementioned embodiments and the same and similar parts will not be repeated.

In this embodiment, a casing 31b of a fluid driving device 30b is consisted of a top part 316b and a seat part 317b. The top part 316b and the seat part 317b are made of different materials. The top part 316b is, for example, made of metal, and the seat part 317b is, for example, made of plastic. The top part 316b of the casing 31b is directly and thermal in contact with the heat source 13. Specifically, the top part 316b of the casing 31b has a thermal absorption surface 3161b and a thermal conductive surface 3162b. The thermal absorption surface 3161b faces away from a liquid inlet 312b and a liquid outlet 313b of the casing 31b. The thermal conductive surface 3162b faces away from the thermal absorption surface 3161b, and different portions of the thermal conductive surface 3162b are respectively located in the liquid inlet 312b and the liquid outlet 313b. The thermal absorption surface 3161b is directly and thermally in contact with the heat source 13. As such, a liquid in the liquid inlet 312b and the liquid outlet 313b can perform heat exchange with the heat source 13 via the top part 316b of the casing 31b, and thus the heat generated by the heat source 13 can be taken away.

In addition, the fluid driving device 30b may further include a plurality of heat dissipation fins 35b. The heat dissipation fins 35b are disposed on the thermal conductive surface 3162b of the top part 316b. The heat dissipation fins 35b can increase the efficiency of the heat exchange between the heat source 13 and the liquid.

Furthermore, the seat part 317 of the casing 31b further has a bottom surface 3171b and a lateral surface 3172b. The bottom surface 3171b of the casing 31b is opposite to the thermal absorption surface 3161b and faces the inner bottom surface 112 of the housing 11. The bottom surface 3171b and the lateral surface 3172b respectively face different directions. Two vent holes 314b and 315b of the casing 31b are respectively located on the lateral surface 3172b and the bottom surface 3171b of the casing 31b.

Figure 8:
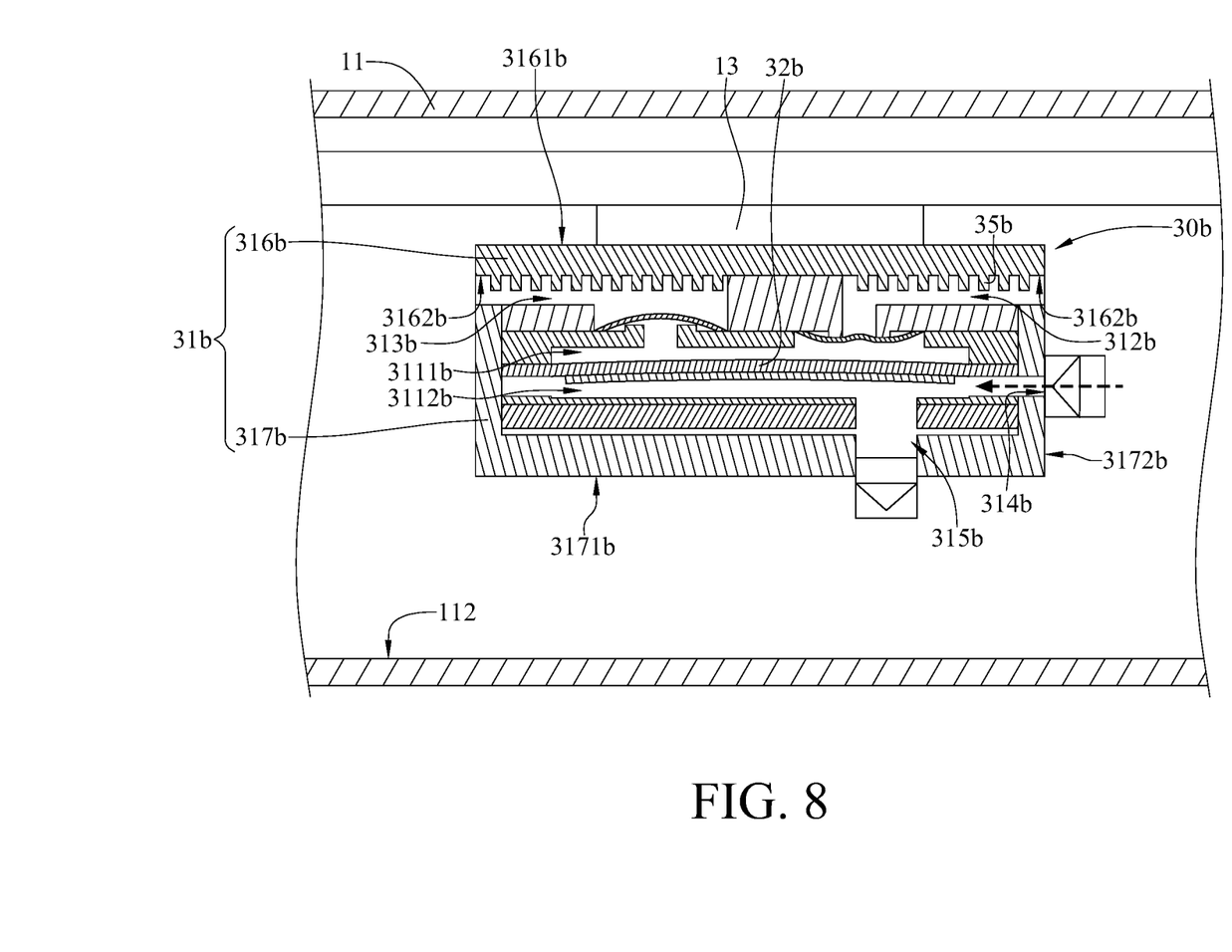
FIG. 8 is a partial enlarged cross-sectional view of the electronic device in FIG. 7 when an oscillation film of a fluid driving device compresses a liquid channel.
Figure 9:
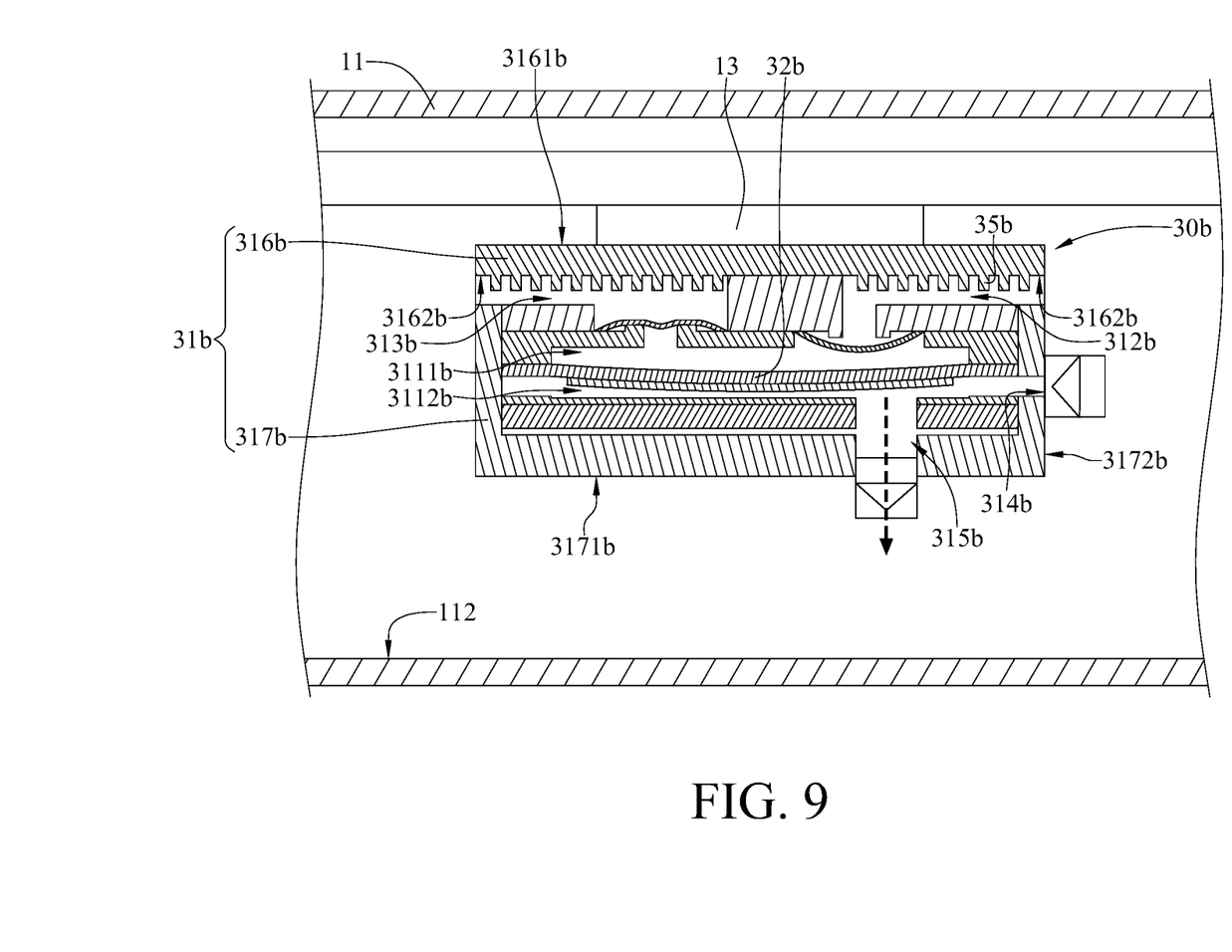
FIG. 9 is a partial enlarged cross-sectional view of the electronic device in FIG. 7 when the oscillation film of the fluid driving device compresses a gas channel.

Then, referring to FIGS. 8 and 9, FIG. 8 is a partial enlarged cross-sectional view of the electronic device in FIG. 7 when an oscillation film 32b of the fluid driving device 30b compresses a liquid channel 3111b, and FIG. 9 is a partial enlarged cross-sectional view of the electronic device in FIG. 7 when the oscillation film 32b of the fluid driving device 30b compresses a gas channel 3112b. Arrows in FIGS. 8 and 9 represent the flow of the gas.

As shown in FIG. 8, when the oscillation film 32b compresses the liquid channel 3111b of the casing 31b, the oscillation film 32b sucks the gas to into the gas channel 3112b from the vent hole 314b. As shown in FIG. 9, when the oscillation film 32b compresses the gas channel 3112b of the casing 31b, the oscillation film 32b forces the gas to flow out of the gas channel 3112b from the vent hole 315b. Since the vent hole 315b is located on the bottom surface 3171b facing the inner bottom surface 112 of the housing 11, the gas flowing out from the vent hole 315b can directly flow toward the inner bottom surface 112 of the housing 11, and thus the heat generated by the heat source 13 is more difficult to reach the housing 11.

In this embodiment, the oscillation film 32b may be made of thermal insulation material, such that the oscillation film 32b and the seat part 317b made of plastic material can prevent the liquid in the liquid inlet 312b, the liquid outlet 313b and the liquid channel 3111b from performing heat exchange with the gas in the gas channel 3112b after absorbing the heat generated by the heat source 13, thereby ensuring the gas flowing out from the vent hole 315b is relatively in low temperature.

According to the electronic devices and the fluid driving devices as discussed above, the oscillation film divides the fluid chamber of the casing into the liquid channel and the gas channel, such that the oscillation film can repeatedly compress the liquid channel and the gas channel to force the liquid existing in the liquid channel and the gas existing in the gas channel to flow during operation. In the case that the fluid driving device is disposed in the internal space of the housing of an electronic device, the fluid driving device can not only trigger the liquid to cool the heat source but also can force the gas to flow to create airflow to disturb the air existing in the internal space of the housing to make the heat generated by the heat source difficult to reach the housing.

In addition, in some embodiments, the vent hole is located on the bottom surface of the casing facing the inner bottom surface of the housing, such that the gas flowing out from the vent hole can directly flow toward the inner bottom surface of the housing, and thus the heat generated by the heat source is more difficult to reach the housing.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A fluid driving device, configured to force a liquid and a gas to flow, comprising:
   a casing, having a fluid chamber, a liquid inlet, a liquid outlet, and at least one vent hole; and
   an oscillation film, movably disposed in the fluid chamber of the casing so as to divide the fluid chamber into a liquid channel and a gas channel that are not fluid-connected to each other, wherein the liquid channel and the gas channel are respectively configured to accommodate the liquid and the gas, the liquid inlet and the liquid outlet are connected to the liquid channel, and the at least one vent hole is connected to the gas channel;
   wherein when the oscillation film is triggered to oscillate to compress the gas channel, the oscillation film forces the liquid to flow into the liquid channel from the liquid inlet and forces the gas to flow out of the gas channel from the at least one vent hole; when the oscillation film is triggered to oscillate to compress the liquid channel, the oscillation film forces the liquid to flow out of the liquid channel from the liquid outlet and forces the gas to flow into the gas channel from the at least one vent hole.

2. The fluid driving device according to claim 1, further comprising two one-way valves, wherein the two one-way valves are respectively disposed at the liquid inlet and the liquid outlet, one of the two one-way valves is configured to allow the liquid to only flow into the liquid channel from the liquid inlet, and the other one of the two one-way valves is configured to allow the liquid to only flow out of the liquid channel from the liquid outlet.

3. The fluid driving device according to claim 1, wherein a quantity of the at least one vent hole is two, when the oscillation film is triggered to oscillate to compress the gas channel, the oscillation film forces the gas to flow out of the gas channel from the two vent holes; when the oscillation film is triggered to oscillate to compress the liquid channel, the oscillation film forces the gas to flow into the gas channel from the two vent holes.

4. The fluid driving device according to claim 1, further comprising two one-way valves, wherein a quantity of the at least one vent hole is two, the two one-way valves are respectively disposed at the two vent holes, one of the two one-way valves is configured to allow the gas to only flow into the gas channel from one of the two vent holes, and the other one of the two one-way valves is configured to allow the gas to only flow out of the gas channel from the other one of the two vent holes.

5. The fluid driving device according to claim 1, wherein the casing further has a thermal absorption surface and a thermal conductive surface, the thermal absorption surface faces away from the liquid inlet and the liquid outlet, the thermal conductive surface faces away from the thermal absorption surface, and different portions of the thermal conductive surface are respectively located in the liquid inlet and the liquid outlet.

6. The fluid driving device according to claim 5, further comprising a plurality of heat dissipation fins, wherein the plurality of heat dissipation fins are disposed on the thermal conductive surface of the casing.

7. An electronic device, comprising:
   a housing, having an internal space;
   a heat source, located in the internal space; and
   a fluid driving device, located in the internal space of the housing and comprising:
   a casing, having a fluid chamber, a liquid inlet, a liquid outlet and at least one vent hole; and
   an oscillation film, movably disposed in the fluid chamber of the casing so as to divide the fluid chamber into a liquid channel and a gas channel that are not fluid-connected to each other, wherein the liquid inlet and the liquid outlet are connected to the liquid channel, and the at least one vent hole is connected to the gas channel.

8. The electronic device according to claim 7, wherein the fluid driving device and the heat source are spaced apart from each other, and the oscillation film is made of a thermal conductive material.

9. The electronic device according to claim 7, wherein the fluid driving device is stacked on the heat source, and the oscillation film is made of a thermal insulation material.

10. The electronic device according to claim 9, wherein the housing further has an inner bottom surface, the inner bottom surface is located in the internal space, the casing further has a bottom surface and a lateral surface, the bottom surface and the lateral surface respectively face two different directions, a bottom surface of the casing faces the inner bottom surface of the housing, the quantity of the at least one vent hole is two, one of the two vent holes is located on the bottom surface of the casing, and the other one of the two vent holes is located on the lateral surface of the casing.

* * * * *